United States Patent
Wellman et al.

[11] Patent Number: 5,724,180
[45] Date of Patent: Mar. 3, 1998

[54] LONG WAVELENGTH INFRARED TRANSPARENT CONDUCTIVE WINDOW

[75] Inventors: Clarke T. Wellman, Thousand Oaks; Michael R. Borden, Santa Monica, both of Calif.

[73] Assignee: Hughes Electronics, Los Angeles, Calif.

[21] Appl. No.: 644,671

[22] Filed: May 7, 1996

Related U.S. Application Data

[63] Continuation of Ser. No. 322,628, Oct. 13, 1994, abandoned.
[51] Int. Cl.⁶ .............................. G02B 1/11; G02B 5/28; G01F 1/21
[52] U.S. Cl. .................. 359/359; 359/585; 359/601; 349/140; 349/158
[58] Field of Search ..................... 359/87, 350, 359, 359/360, 585, 601; 349/140, 158

[56] References Cited

U.S. PATENT DOCUMENTS

| | | | |
|---|---|---|---|
| 4,185,894 | 1/1980 | Hilton et al. | 359/87 |
| 4,693,561 | 9/1987 | Ashley | 359/87 |
| 4,778,731 | 10/1988 | Kraatz et al. | 359/359 |
| 4,907,846 | 3/1990 | Tustison et al. | 359/359 |
| 4,995,684 | 2/1991 | Tustison et al. | 359/359 |
| 5,080,455 | 1/1992 | King et al. | 359/350 |
| 5,191,453 | 3/1993 | Okumura | 359/87 |
| 5,300,449 | 4/1994 | Okumura | 359/87 |

*Primary Examiner*—Jon W. Henry
*Attorney, Agent, or Firm*—G. R. Lindeen, III; W. K. Denson-Low

[57] ABSTRACT

An optical device comprising an electrode (<200 ohms/square) that is transparent to infrared radiation through and beyond the mid-wavelength infrared (3-5 micrometers), and long wavelength infrared (8-12 micrometers), out to 30 micrometers. The optical device is comprised of a sandwich of a thin (≦0.001") conductive silicon wafer optically contacted or bonded to an optically transparent substrate. Typical substrates that may be employed are cadmium telluride, zinc sulfide or zinc selenide substrates. The substrate provides the rigidity necessary to prevent optical distortion which can result from bowing caused by mounting stresses. The optical device provides an electrode having high infrared transmission without the optical diffraction effects produced by a conductive grid. Unlike conductive coatings, the optical device does not incur transmission degradation caused by temperature increases. The optical device provides an optical window for use with liquid crystal light valves, and the like, or where heating and/or electromagnetic shielding is required together with long wavelength infrared transmittance.

14 Claims, 1 Drawing Sheet

LONG WAVELENGTH INFRARED TRANSPARENT CONDUCTIVE WINDOW

This is a continuation application Ser. No. 08/322,628, filed Oct. 13, 1994 now abandoned.

BACKGROUND

The present invention relates to a transparent optical windows, and more particularly, to a long wavelength infrared transparent conductive window for use with liquid crystal light valves, and the like.

The prior art relating to transparent windows for use with liquid crystal light valves involves the use of a 0.25" thick germanium counter electrode. However, this window is only suitable for transmission up to about 12 micrometers, and does not provide sufficient transmission for use in the 17–26 micrometer bandpass or beyond.

Conventional conductive coatings suffer severe transmission degradation especially in the 8–12 micrometer bandpass and beyond. There is no conductive coating currently available that transmits more than about 30% in the 8–12 micrometer bandpass. The performance of these coatings is considerably worse beyond 12 micrometers, given the wavelength squared increase in free carrier absorption.

A conceivable alternative approach to providing an electrode that is transparent in the 17–26 micrometer bandpass would involve the use of a conductive metal mesh deposited on a transparent window. However, such a device would impart obscuration and image degradation caused by diffraction effects. In addition, such an approach would be relatively expensive considering the microlithographic process that is used to apply the conductive meshes.

Therefore, it is an objective of the present invention to provide for an improved long wavelength infrared transparent conductive window for use with liquid crystal light valves, for heating applications, or for electromagnetic shielding applications, and the like, that overcomes the problems of conventional approaches.

SUMMARY OF THE INVENTION

In order to meet the above and other objectives, the present invention is a relatively low-cost optical device comprising an electrode (<200 ohms/square) for a liquid crystal light valve that is transparent to infrared radiation through and beyond the mid-wavelength infrared (3–5 micrometers), and long wavelength infrared (8–12 micrometers), out to 30 micrometers. The device is comprised of a sandwich of a thin ($\leq 0.001$") conductive silicon wafer optically contacted or bonded to an optically transparent substrate. Typical substrates that may be employed are cadmium telluride (CdTe), zinc sulfide or zinc selenide substrates, or diamond substrates. The substrate provides the rigidity necessary to prevent optical distortion which can result from bowing caused by mounting stresses.

The novelty of the present invention is that it provides an electrode with high infrared transmission without the optical diffraction effects produced by a conductive grid. Conventional conductive coatings suffer severe transmission degradation especially in the 8–12 micrometer bandpass and beyond. There is no conductive coating currently available that transmits more than 30% in the 8–12 micrometer bandpass or beyond. Additionally, and unlike conductive coatings, the present invention does not incur transmission degradation caused by temperature increases. Furthermore, the present invention does not suffer from diffraction induced image degradation which occurs with conductive meshes.

A dual band optical window that transmits both 6–11 micrometer and 17–26 micrometer bandpasses, and provides sufficient conductivity to function as an electrode, is required to implement a dual band embodiment of an infrared liquid crystal light valve (IR-LCLV) projector under development by the assignee of the present invention. The present invention provides such a dual band optical window.

The present invention may also find use in similar applications requiring both low resistivity and high transmission in medium wavelength infrared (MWIR), or long wavelength infrared (LWIR) applications, or beyond, such as infrared imaging systems that are required to survive EMI/EMP threats, for example.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
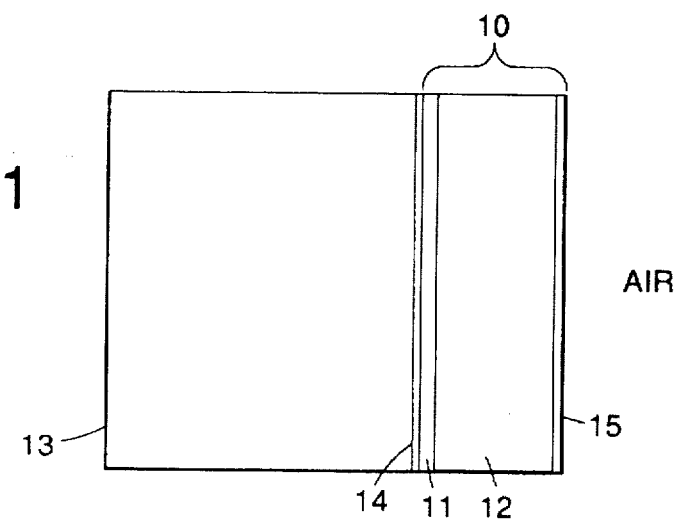
FIG. 1 shows an optical device comprising a silicon/CdTe transparent electrode in accordance with the principles of the present invention.

Referring to the drawing figures, FIG. 1 shows an optical device 10 comprising a silicon/CdTe transparent electrode 10 in accordance with the principles of the present invention, for use with a liquid crystal light valve projector, for example. The optical device 10 has been designed for use as a window that covers a liquid crystal light valve 13. The optical device 10 is comprised of an optically contacted or bonded sandwich of a thin conductive silicon wafer 11 and an optically transparent substrate 12 such as a CdTe substrate 12. The silicon wafer 11 is less than or equal to 0.001 inches thick. The silicon wafer 11 has a conductivity of between 5 and 200 ohms/square.

Figure 2:
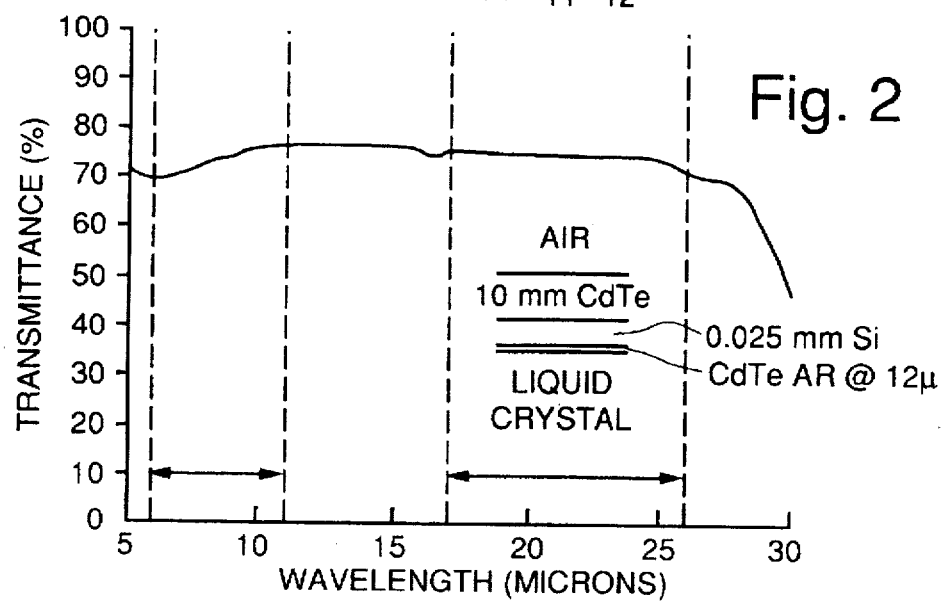
FIG. 2 shows a graph illustrating the predicted optical performance of the optical device of FIG. 1.

FIG. 2 shows a graph illustrating the predicted optical performance of the optical device 10 of FIG. 1. The performance of the optical device 10 has been modeled using appropriate optical constants and an antireflection coating 14 deposited at the interface between the silicon wafer 11 and liquid crystal 13, as is illustrated in FIG. 1. In addition, an antireflection coating 15 may be deposited at the interface between air and the cadmium telluride substrate 12 to further reduce reflection losses.

Figure 3:
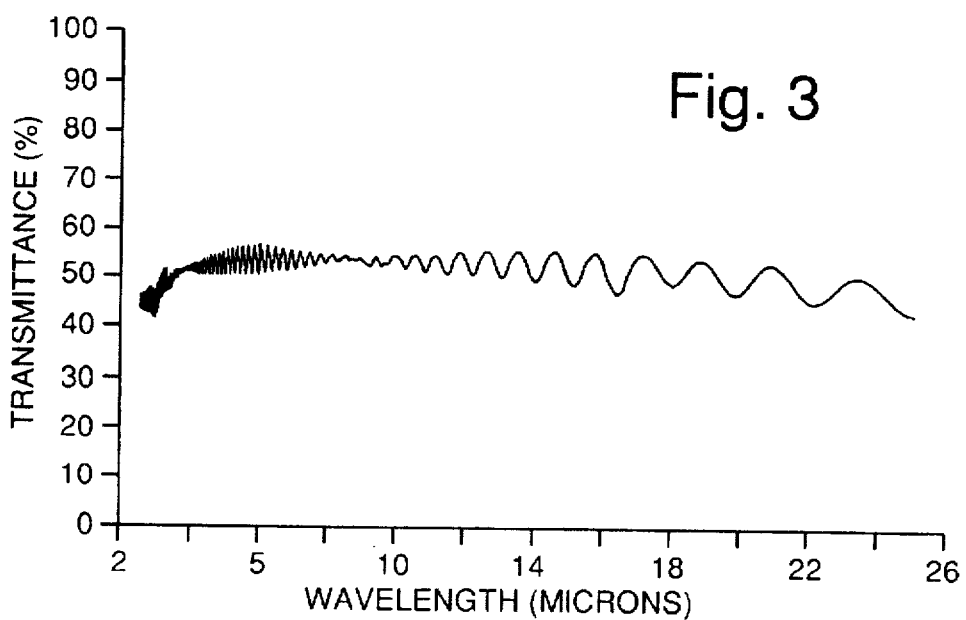
FIG. 3 shows a graph illustrating the measured optical performance of the optical device of FIG. 1 without antireflection coatings and from incidence and exit media comprising air.

A simple prototype optical device 10 in accordance with the present invention was fabricated. This optical device is comprised of a thin (0.001"), conductive (20 ohms/square) silicon wafer 11 contacted to a cadmium telluride substrate 12. The measured spectral transmission of the prototype optical device 10 is shown in FIG. 3. More specifically, FIG. 3 shows a graph illustrating the measured optical performance of the optical device 10 of FIG. 1 without antireflection coatings 14, 15 and from incidence and exit media comprising air. Transmission of the optical device 10 remains high through the infrared portion of the spectrum out to about 25 micrometers. Free electron absorption would be characterized by a consistently decreasing transmission.

Much of the loss in transmission arises from reflection from the exterior surfaces of the optical device 10. These reflection losses can be reduced using additional antireflection coatings.

Despite the fact that the prototype optical device 10 does not incorporate antireflection coatings, the transmission at longer wavelengths is still much higher than any known optical device using conductive coatings. In fact, a conductive coating with a similar sheet resistivity as the optical device 10 would most likely transmit less than 5% beyond 18 micrometers. Therefore, the present invention represents a dramatic improvement over conductive coating alternatives employed in conventional practice.

For constant sheet resistivities, a thin conductive silicon wafer 11 provides higher optical transmission than thicker, higher resistivity silicon wafers 11 because the dominant absorption processes involve intrinsic silicon absorptions at the longer wavelengths. Thinner silicon wafers 11 suffer considerably less transmission loss, especially at the longer wavelengths (beyond approximately 6 micrometers) where silicon lattice and silicon-oxygen vibration absorption occur.

The electrode feature of the optical device 10 is required to control the orientation of the liquid crystal 13 during use. For alternative tactical infrared window applications, the conductive silicon wafer 11 provides protection from EMI/EMP threats.

The cadmium telluride substrate 12 is used to provide adequate stiffness to prevent optical distortions from bowing which could occur when mounting the relatively thin silicon wafer 11. For tactical window applications, a more durable substrate 12 such as zinc sulfide, zinc selenide, or diamond may be used. The zinc sulfide or zinc selenide substrates 12 are not transparent out to 30 microns, but may be used in the 3–5 and 8–12 micron spectral regions. Antireflection coatings may be used to reduce reflection losses at the interface between the silicon wafer 11 and the liquid crystal 13, and at the interface between air and the cadmium telluride substrate 12 and between the silicon wafer 11 and the cadmium telluride substrate 12.

Silicon wafers 11 with thicknesses of 0.001 inches exhibit remarkable strength. Two inch diameter wafers 11 may be bent more than a ¼" from flat without fracture. Therefore, handling of the thin wafers 11 does not represent a difficult problem. Additionally, silicon and cadmium telluride materials have sufficiently similar coefficients of thermal expansion which enables optical contacting of adequately flat, smooth surfaces and use throughout anticipated temperature extremes.

Thus there has been described a new and improved optical device comprising a long wavelength infrared transparent conductive window for use with liquid crystal light valves, and the like. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Optical apparatus comprising:
   a thin conductive bulk silicon substrate having a predetermined thickness and an electrical resistivity of between 5 and 200 ohms per square; and
   infrared transparent substrate contacting a surface of the thin conductive silicon substrate, said optically transparent substrate having a thickness greater than said thickness of said silicon substrate.

2. The apparatus of claim 1 wherein the thin conductive silicon substrate is less than or equal to 0.001 inches thick.

3. The apparatus of claim 1, wherein the infrared transparent substrate is cadmium telluride.

4. The apparatus of claim 3, wherein the thin conductive silicon substrate is less than or equal to 0.001 inches thick.

5. The apparatus of claim 1, wherein the infrared transparent substrate is zinc sulfide.

6. The apparatus of claim 5, wherein the thin conductive silicon substrate is less than or equal to 0.001 inches thick.

7. The apparatus of claim 1, wherein the infared transparent substrate is zinc selenide.

8. The apparatus of claim 7, wherein the thin conductive silicon substrate is less than or equal to 0.001 inches thick.

9. Optical apparatus comprising:
   a thin conductive bulk silicon substrate having a predetermined thickness; and
   an optically transparent substrate contacting a surface of the thin conductive silicon substrate, said optically transparent substrate having a thickness greater than said thickness of said silicon substrate, and wherein said optically transparent substrate is transparent to all radiation having a wavelength within the range of from 3 to 30 micrometers;
   a liquid crystal; and
   an antireflection coating deposited between the silicon substrate and the liquid crystal.

10. The apparatus of claim 3, further comprising:
    an antireflection coating deposited on a surface of the cadmium telluride substrate that is exposed to air.

11. Optical apparatus comprising:
    a thin conductive bulk silicon substrate;
    an optically transparent substrate contacting a surface of the thin conductive bulk silicon substrate, said optically transparent substrate having a thickness greater than said thickness of said silicon substrate, and wherein said optically transparent substrate is transparent to all radiation having a wavelength within the range of 3 to 30 micrometers;
    a liquid crystal; and
    an antireflection coating deposited between the silicon substrate and the liquid crystal and an antireflection coating deposited on a surface of the optically transparent substrate that is exposed to air.

12. Optical apparatus comprising:
    a thin conductive bulk silicon substrate having a resistivity of between 5 and 200 ohms/square;
    an infrared transparent substrate contacting a surface of the thin conductive silicon substrate, said optically transparent substrate having a thickness greater than said thickness of said silicon substrate;
    a liquid crystal; and
    an antireflection coating deposited between the silicon substrate and the liquid crystal.

13. The optical apparatus of claim 12, wherein the silicon substrate has a thickness of less than or equal to 0.001 inches thick.

14. Optical apparatus comprising:
    a conductive bulk silicon substrate having a thickness of no greater than 0.001 inches; and
    an infrared transparent substrate contacting a surface of the thin conductive silicon substrate, said optically transparent substrate having a thickness greater than said thickness of said silicon substrate.

* * * * *